United States Patent [19]
Keeth

[11] Patent Number: 6,084,434
[45] Date of Patent: *Jul. 4, 2000

[54] ADJUSTABLE OUTPUT DRIVER CIRCUIT

[75] Inventor: Brent Keeth, Boise, Id.

[73] Assignee: Micron Technology, Inc., Boise, Id.

[ * ] Notice: This patent is subject to a terminal disclaimer.

[21] Appl. No.: 09/328,884

[22] Filed: Jun. 9, 1999

Related U.S. Application Data

[63] Continuation of application No. 08/757,738, Nov. 26, 1996, Pat. No. 5,949,254.

[51] Int. Cl.$^7$ .............................................. H03K 19/0185
[52] U.S. Cl. .................................. 326/87; 326/27; 326/83
[58] Field of Search .................................. 326/26, 27, 30, 326/50, 86, 87; 327/380, 381

[56] References Cited

U.S. PATENT DOCUMENTS

| | | |
|---|---|---|
| 4,096,402 | 6/1978 | Schroeder et al. . |
| 4,183,095 | 1/1980 | Ward .......................................... 326/86 |
| 4,404,474 | 9/1983 | Dingwall . |
| 4,638,187 | 1/1987 | Boler et al. . |
| 4,758,743 | 7/1988 | Dehganpour et al. . |
| 4,789,796 | 12/1988 | Foss . |
| 4,829,199 | 5/1989 | Prater . |

(List continued on next page.)

FOREIGN PATENT DOCUMENTS

| | | |
|---|---|---|
| 0 382 124 A2 | 8/1990 | European Pat. Off. . |
| 0 450 871 A2 | 10/1991 | European Pat. Off. . |
| 0 599 631 A1 | 6/1994 | European Pat. Off. . |
| 0 655 741 A2 | 5/1995 | European Pat. Off. . |
| 0 680 049 A2 | 11/1995 | European Pat. Off. . |
| 3 832 378 | 12/1989 | Germany . |
| 2-112317 | 4/1990 | Japan . |
| 2-119427 | 5/1990 | Japan . |
| 4 906 20 | 3/1992 | Japan . |
| 4-135311 | 5/1992 | Japan . |
| 5-136664 | 6/1993 | Japan . |
| 0 528 286 8 | 10/1993 | Japan . |
| 6-282817 | 10/1994 | Japan . |
| 6-326590 | 11/1994 | Japan . |
| WO 96/10866 | 4/1996 | WIPO . |

OTHER PUBLICATIONS

Descriptive literature entitled, "400MHz SLDRAM, 4M×16 SLDRAM Pipelined, Eight Bank, 2.5 V Operation," SLDRAM Consortium Advance Sheet, published throughout the United States, pp. 1–22.

"Draft Standard for a High–Speed Memory Interface (SyncLink)," Microprocessor and Microcomputer Standards Subcommittee of the IEEE Computer Society, Copyright 1996 by the Institute of Electrical and Electronic Engineers, Inc. New York, NY, pp. 1–56.

Chapman, J. et al., "A Low–Cost High–Performance CMOS Timing Vernier for ATE", IEEE International Test Conference, Paper 21.2, 1995, pp. 459–468.

Ljuslin, C. et al., "An Intregrated 16–channel CMOS Time to Digital Converter", IEEE Nuclear Science Symposium & Medical Imaging Conference Record, vol. 1, 1993, pp. 625–629.

Taguchi, M. et al., "A 40–ns 64–Mb DRAM with 64–b Parallel Data Bus Architecture", IEEE Journal of Solid–State Circuits, vol. 26, No. 11, Nov. 1991, pp. 1493–1497.

Primary Examiner—Jon Santamauro
Assistant Examiner—Don Phu Le
Attorney, Agent, or Firm—Dorsey & Whitney LLP

[57] ABSTRACT

An output driver circuit offers wave-shaping and logic level adjustment for high speed data communications in a synchronous memory such as a dynamic random access memory (DRAM). Level adjustment is obtained by resistive division between a termination resistor and controllable impedances between an output node and VDD and VSS power supplies. Wave-shaping functions include slew rate modification of the signal at the output node, by sequentially turning on or off output transistors in response to a transition in an input signal. Different schemes of weighting the output transistors obtains different wave-shaping, characteristics of the output signal.

28 Claims, 7 Drawing Sheets

U.S. PATENT DOCUMENTS

| | | | |
|---|---|---|---|
| 4,888,498 | 12/1989 | Kadakia . | |
| 4,958,088 | 9/1990 | Farah-Bakhsh et al. . | |
| 4,961,010 | 10/1990 | Davis | 326/87 |
| 4,984,204 | 1/1991 | Sato et al. | 365/189.11 |
| 4,992,676 | 2/1991 | Gerosa et al. . | |
| 5,001,369 | 3/1991 | Lee . | |
| 5,111,075 | 5/1992 | Ferry et al. | 326/87 |
| 5,122,690 | 6/1992 | Bianchi . | |
| 5,128,560 | 7/1992 | Chern et al. . | |
| 5,128,563 | 7/1992 | Hush et al. . | |
| 5,134,311 | 7/1992 | Biber et al. . | |
| 5,150,186 | 9/1992 | Pinney et al. | 357/42 |
| 5,165,046 | 11/1992 | Hesson . | |
| 5,179,298 | 1/1993 | Hirano et al. . | |
| 5,194,765 | 3/1993 | Dunlop et al. . | |
| 5,220,208 | 6/1993 | Schenck . | |
| 5,220,209 | 6/1993 | Seymour | 326/87 |
| 5,239,206 | 8/1993 | Yanai . | |
| 5,243,703 | 9/1993 | Farmwald et al. | 395/325 |
| 5,254,883 | 10/1993 | Horowitz et al. . | |
| 5,274,276 | 12/1993 | Casper et al. . | |
| 5,276,642 | 1/1994 | Lee | 365/189.04 |
| 5,278,460 | 1/1994 | Casper . | |
| 5,281,865 | 1/1994 | Yamashita et al. . | |
| 5,311,481 | 5/1994 | Casper et al. | 365/230.06 |
| 5,321,368 | 6/1994 | Hoelzle | 328/63 |
| 5,347,177 | 9/1994 | Lipp . | |
| 5,347,179 | 9/1994 | Casper et al. . | |
| 5,349,247 | 9/1994 | Hush et al. . | |
| 5,355,391 | 10/1994 | Horowitz et al. | 375/36 |
| 5,361,002 | 11/1994 | Casper | 327/530 |
| 5,367,205 | 11/1994 | Powell | 326/27 |
| 5,400,283 | 3/1995 | Raad | 365/203 |
| 5,428,311 | 6/1995 | McClure | 327/525 |
| 5,432,823 | 7/1995 | Gasbarro et al. | 375/356 |
| 5,438,545 | 8/1995 | Sim | 365/189.05 |
| 5,440,260 | 8/1995 | Hayashi et al. | 327/278 |
| 5,451,898 | 9/1995 | Johnson | 327/563 |
| 5,457,407 | 10/1995 | Shu et al. | 326/30 |
| 5,473,575 | 12/1995 | Farmwald et al. | 365/230.06 |
| 5,485,490 | 1/1996 | Leung et al. | 375/371 |
| 5,488,321 | 1/1996 | Johnson | 327/66 |
| 5,497,127 | 3/1996 | Sauer | 331/17 |
| 5,498,990 | 3/1996 | Leung et al. | 327/323 |
| 5,506,814 | 4/1996 | Hush et al. | 365/230.03 |
| 5,508,638 | 4/1996 | Cowles et al. | 326/38 |
| 5,513,327 | 4/1996 | Farmwald et al. | 395/309 |
| 5,568,077 | 10/1996 | Sato et al. | 327/199 |
| 5,574,698 | 11/1996 | Raad | 365/230.06 |
| 5,576,645 | 11/1996 | Farwell | 327/94 |
| 5,578,941 | 11/1996 | Sher et al. | 326/34 |
| 5,581,197 | 12/1996 | Motley et al. | 326/30 |
| 5,589,788 | 12/1996 | Goto | 327/276 |
| 5,590,073 | 12/1996 | Arakawa et al. | 365/185.08 |
| 5,602,494 | 2/1997 | Sundstrom | 326/86 |
| 5,619,473 | 4/1997 | Hotta | 365/238.5 |
| 5,621,340 | 4/1997 | Lee et al. | 327/65 |
| 5,621,690 | 4/1997 | Jungroth et al. | 365/200 |
| 5,627,780 | 5/1997 | Malhi | 365/185.09 |
| 5,627,791 | 5/1997 | Wright et al. | 365/222 |
| 5,631,872 | 5/1997 | Naritake et al. | 365/227 |
| 5,636,163 | 6/1997 | Furutani et al. | 365/189.01 |
| 5,636,173 | 6/1997 | Schaefer | 365/230.03 |
| 5,636,174 | 6/1997 | Rao | 365/230.03 |
| 5,638,335 | 6/1997 | Akiyama et al. | 365/230.03 |
| 5,644,252 | 7/1997 | Watarai | 326/30 |
| 5,661,416 | 8/1997 | Takada et al. | 326/30 |
| 5,668,763 | 9/1997 | Fujioka et al. | 365/200 |
| 5,694,065 | 12/1997 | Hamasaki et al. | 327/108 |
| 5,838,177 | 11/1998 | Keeth | 327/108 |

ADJUSTABLE OUTPUT DRIVER CIRCUIT

CROSS-REFERENCE TO RELATED APPLICATION

This application is a continuation of U.S. patent application Ser. No. 08/757,738, filed Nov. 26, 1996 now U.S. Pat. 5,949,254.

FIELD OF THE INVENTION

This invention relates generally to integrated circuits and particularly to data output drivers for high speed data transmission.

BACKGROUND

Integrated circuits typically include a number of input/output pins which are used for communication with additional circuitry. For example, an integrated memory device such as a dynamic random access memory (DRAM) Includes both control inputs for receiving memory operation control signals, and data pins for bi-directional data communication with an external system or processor.

The data transmission rate of modern integrated circuits is primarily limited by internal circuitry operating speeds. Communication networks can typically transmit signals between circuitry at a rate that is faster than the capacity of some integrated circuits. To address the need for faster circuits, a group of integrated circuits can be combined on a common bus. In this configuration, each integrated circuit operates in a coordinated manner with the other integrated circuits to share data that is transmitted at a high speed. For example, a group of memory devices, such as DRAMs, static RAMs, or read only memories (ROM), can be connected to a common data bus. The data rate of the bus may be substantially faster than the feasible operating speed of the individual memories. Each memory, therefore, is operated so that while one memory processes received data, another memory receives new data. By providing an appropriate number of memory devices and an efficient control system, very high speed data transmissions can be achieved.

As the transmission rate of the data communication signals continues to increase, new circuitry and methods are needed to accurately transmit data from each integrated circuit. One proposed solution is a bus driver described in U.S. Pat. No. 5,254,883. This bus driver circuit uses parallel output transistors that single-endedly couple the bus to a power supply. The output transistors are fabricated in different sizes and selectively activated to control the bus current. This approach is directed towards accurate bus current control to establish the bus voltage at an accurate logic voltage level. However, the approach lacks control over the transition of the bus voltage between logic voltage levels.

For the reasons stated above, and for other reasons stated below which will become apparent to those skilled in the art upon reading and understanding the present specification, there is a need in the art for a high speed output driver circuit which is fully adjustable, and offers control of the transition of the bus voltage between logic voltage levels.

SUMMARY

The present invention provides output driver circuit capable of wave-shaping and level adjustment of an output voltage signal. A first plurality of output transistors electrically couples or decouples an output node to a first power supply. A control circuit is coupled to a control terminal of each output transistor in the first plurality of output transistors. The control circuit sequentially turns on or off the output transistors in the first plurality of output transistors in response to a transition in a first input signal received by the control circuit.

In one embodiment, the output driver circuit includes a first impedance interposed between the first plurality of output transistors and the first power supply. A second plurality of output transistors electrically couples or decouples the output node to a second power supply. The control circuit is coupled to a control terminal of each output transistor in the second plurality of output transistors. The control circuit sequentially turns on or off the output transistors in the second plurality of output transistors in response to a transition in a second input signal received by the control circuit. The output driver circuit also includes a second impedance interposed between the first plurality of output transistors and the first power supply.

The present invention includes method and apparatus of wave-shaping a signal, including logic voltage levels and a slew rate of a voltage transition therebetween. The present invention is particularly useful for high speed data communications, such as in a synchronous memory including a dynamic random access memory (DRAM).

BRIEF DESCRIPTION OF THE DRAWINGS

In the drawings, like numerals describe substantially similar components throughout the several views.

DETAILED DESCRIPTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
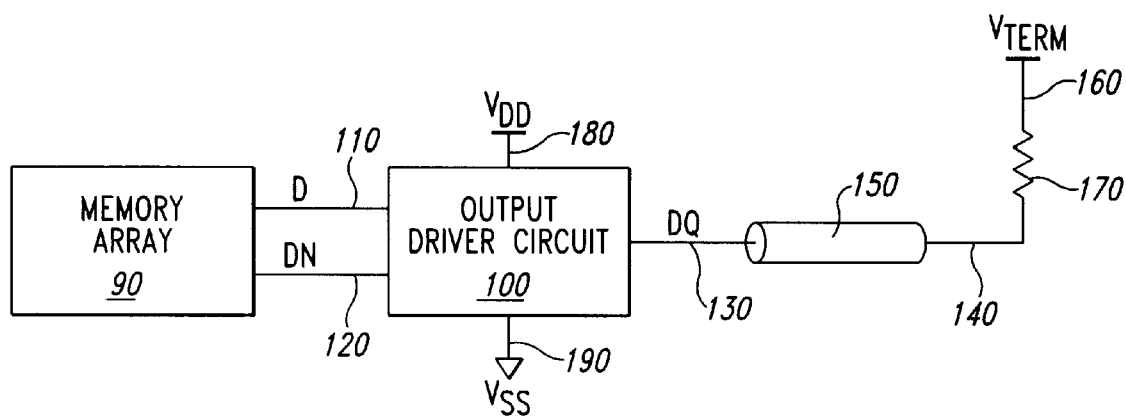
FIG. 1 is a generalized schematic illustration of one embodiment of the present invention and the environment in which it is used.

FIG. 1 is a generalized schematic illustration of one embodiment of the present invention and the environment in which it is used. In FIG. 1, memory array 90 includes memory cells and read circuitry for reading data stored in the memory cells. Output driver circuit 100 receives the data read from memory array 90 as first input signal D at node 110 and its binary complement, second input signal DN, at node 120, and provides in response thereto an output signal DQ at output node 130. Output node 130 is electrically coupled to receiving node 140 through data communication line 150, which may include distributed interconnect, pad, and other resistance and capacitance both on and off the integrated circuit chip. Output node 130 is also electrically coupled to a termination power supply voltage, $V_{term}$, at termination node 160 through termination resistor 170. First and second power supply voltages, such as $V_{DD}$ at node 180 and $V_{SS}$ at node 190 are provided to output driver circuit 100. $V_{term}$ is typically a voltage approximately midway between $V_{DD}$ and $V_{SS}$.

Figure 2:
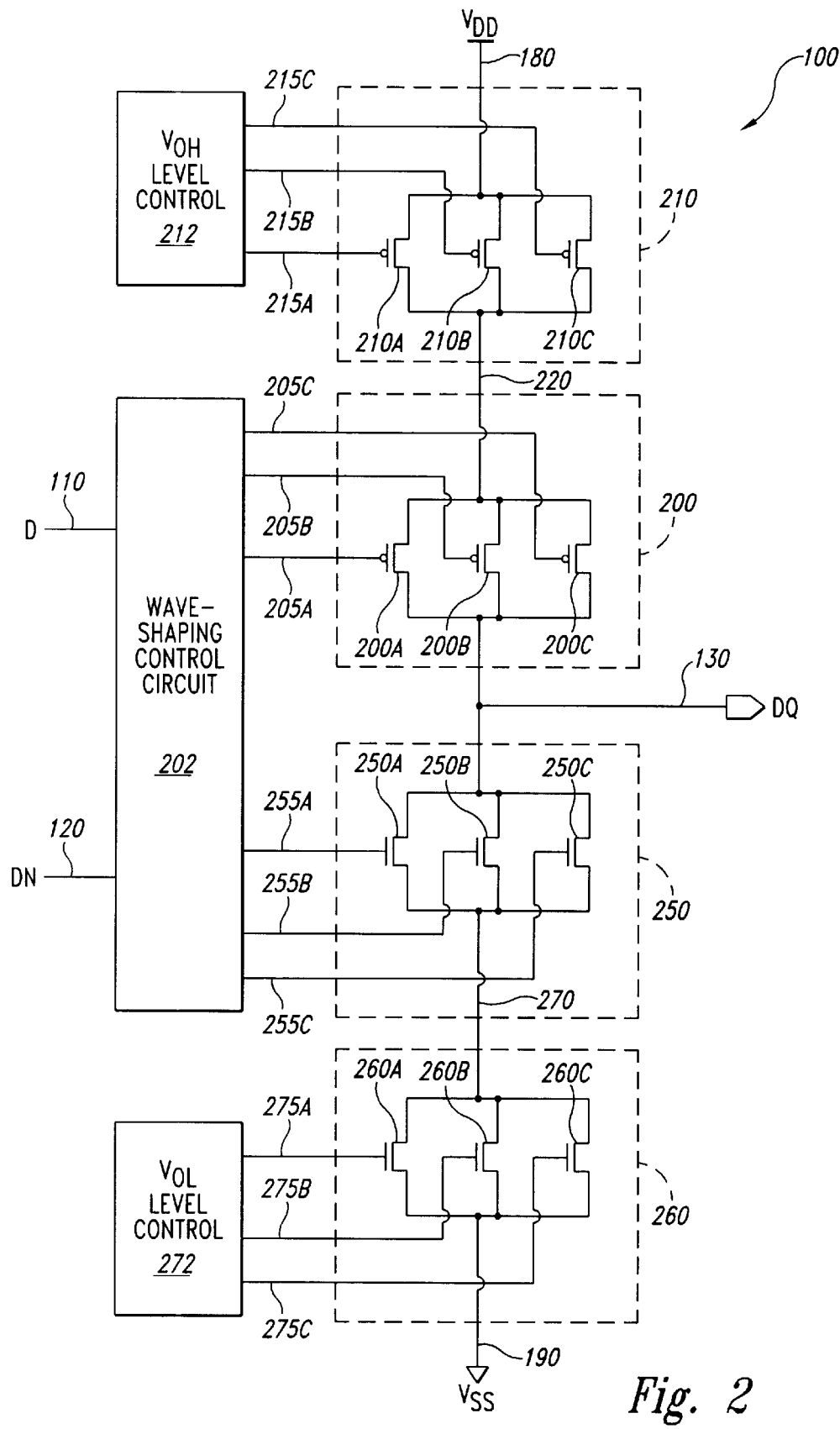
FIG. 2 is a generalized schematic illustration that illustrates in more detail one embodiment of the output driver circuit of FIG. 1.

FIG. 2 is a generalized schematic illustration that illustrates one embodiment of the output driver circuit 100 in more detail. In FIG. 2, a first plurality 200 of output transistors, such as PFETs 200A–C, have their drain terminals coupled together and to output node 130. Wave-shaping control circuit 202 provides independent control terminal signals at nodes 205A–C to the respective gate terminals of PFETs 200A–C. The source terminals of PFETs 200A–C are coupled together and to $V_{DD}$ through a first impedance 210.

In one embodiment, first impedance 210 comprises active devices such as PFETs 210A–C, having their drain terminals coupled together and to the source terminals at node 220 of each of PFETs 200A–C in the first plurality 200 of output transistors. PFETs 210A–C have their source terminals coupled together and to $V_{DD}$ at node 180. $V_{OH}$ level control circuit 212 provides independent control terminal signals at nodes 215A–C to the respective gate terminals of PFETs 210A–C to programmably control first impedance 210 by varying how many and which of PFETs 210A–C are turned on. Those of PFETs 210A–C that are turned on contribute to the effective value of the impedance between node 220 and $V_{DD}$ at node 180. PFETs 210A–C may have varying width/length aspect ratios, or may each comprise different multiples of instances of parallel-connected PFETs of the same width/length aspect ratio, or may otherwise be designed for optimizing the effective value of the impedance between node 220 and $V_{DD}$ at node 180 by permuting which of PFETs 210A–C are turned on.

Impedance 210 forms a resistive divider with termination resistor 170, the impedance values of which determine the binary high logic voltage level, $V_{OH}$, at output node 130. $V_{OH}$ level control circuit 212, by controlling which of PFETs 210A–C are turned on, controls the value of impedance 210 and, in turn, controls the value of $V_{OH}$.

A second plurality 250 of output transistors, such as NFETs 250A–C, have their drain terminals coupled together and to output node 130. Wave-shaping control circuit 202 provides independent control terminal signals at nodes 255A–C to the respective gate terminals of NFETs 250A–C. The source terminals of NFETs 250A–C are coupled together and to $V_{SS}$ through a second impedance 260.

In one embodiment, second impedance 260 comprises active devices such as NFETs 260A–C, having their drain terminals coupled together and to the source terminals at node 270 of each of NFETs 250A–C in the second plurality 250 of output transistors. NFETs 260A–C have their source terminals coupled together and to $V_{SS}$ at node 190. $V_{OL}$ level control circuit 272 provides independent control terminal signals at nodes 275A–C to the respective gate terminals of NFETs 260A–C to programmably control impedance 260 by varying how many and which of NFETs 260A–C are turned on. Those of NFETs 260A–C that are turned on contribute to the effective impedance between node 270 and $V_{SS}$ at node 190. NFETs 260A–C may have varying width/length aspect ratios, or may each comprise different multiples of instances of parallel-connected NFETs of the same width/length aspect ratio, or may otherwise be designed for optimizing the effective impedance between node 270 and VSS at node 190 by permuting which of NFETs 260A–C are turned on.

Impedance 260 forms a resistive divider with termination resistor 170, the impedance values of which determine the binary low logic voltage level, $V_{OL}$, at output node 130. $V_{OL}$ level control circuit 272, by controlling which of NFETs 260A–C are turned on, controls the value of impedance 260 and, in turn, controls the value of $V_{OL}$.

In the above description first plurality 200 of output transistors, second plurality 250 of output transistors, first impedance 210, and second impedance 260 have each been described, for clarity of illustration, as comprising three field-effect transistors. However, it is understood that the exact number of said transistors may be selected according to individual design constraints without departing from the scope and spirit of the present invention.

Figure 3:
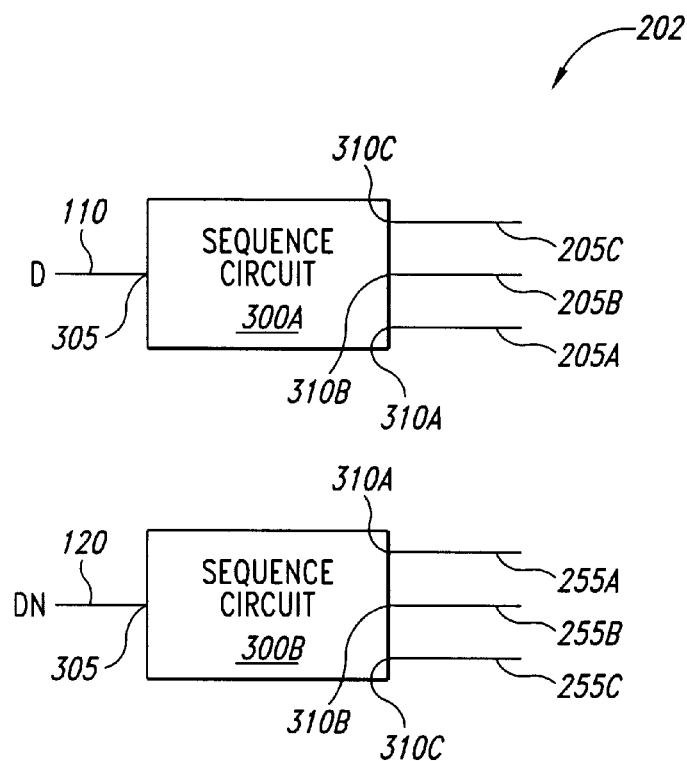
FIG. 3 is a generalized schematic illustration that illustrates the wave-shaping control circuit of FIG. 2 in more detail.

FIG. 3 is a generalized schematic illustration that illustrates wave-shaping control circuit 202 in more detail. Wave-shaping circuit 202 includes sequence circuits 300A–B receiving at respective first and second input signals D and DN at input terminals 305 that are electrically coupled to respective nodes 110 and 120. Sequence circuits 300A–B respectively provide, in response thereto, sequentially time-delayed control terminal signals at output terminals 310A–C that are electrically coupled to respective nodes 205A–C and 255A–C. The sequentially time-delayed control terminal signals effect coupling of output node 130 to respective $V_{DD}$ at node 180 and $V_{SS}$ at node 190 through respective first plurality 200 and second plurality 250 of output transistors. As will be described below, by providing sequentially delayed control terminal signals to the output transistors, sequence circuits 300A–B provide control over the slew rate of the voltage at output node 130, with the slew rate control being substantially independent of the $V_{OH}$ and $V_{OL}$ level control provided by first and second impedances 210 and 260, respectively.

Figure 4:
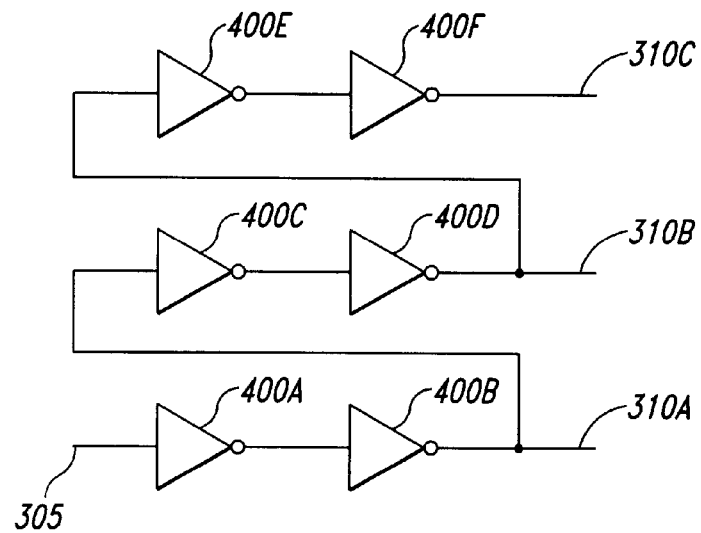
FIG. 4 is a generalized schematic illustration that illustrates one embodiment of each of sequence circuits of FIG. 3 in more detail.

FIG. 4 is a generalized schematic illustration that illustrates one embodiment of each of sequence circuits 300A–B in more detail. FIG. 4 includes a string of series-cascaded inverters 400A–F, for receiving an input signal at input terminal 305, and providing a number of sequentially delayed signals in response thereto at output terminals 310A–C. In this embodiment, the delay between the signal transition at the input terminal 305 and the signal transition at each of the output terminals 310A–C is determined by the inverter delays of the corresponding number of inverters therebetween, including interconnect capacitance and load capacitance of subsequent inverters and output transistors.

Figure 5:
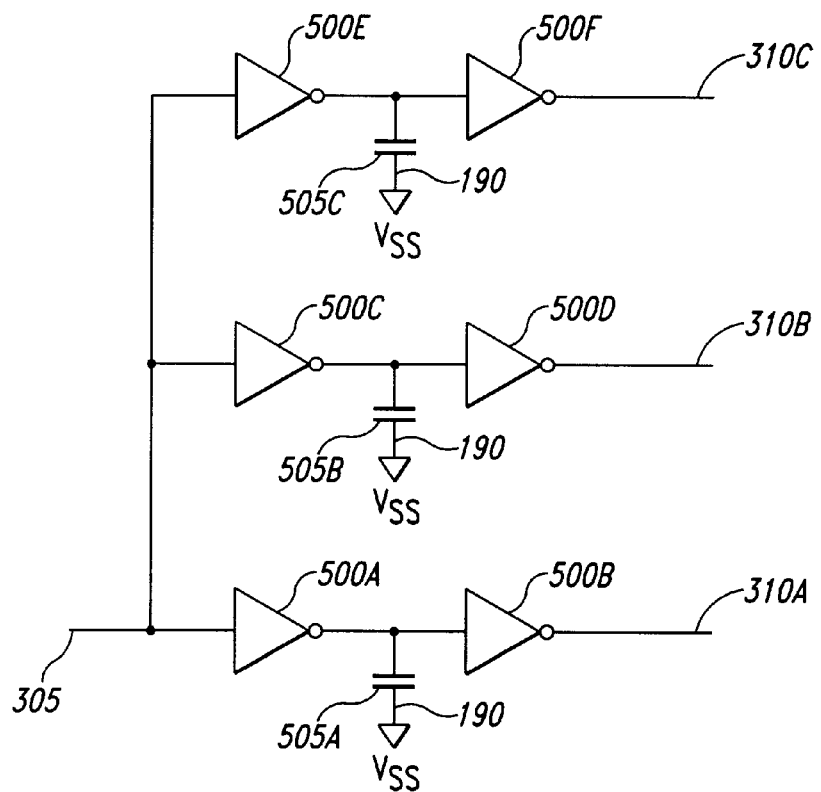
FIG. 5 is a generalized schematic illustration that illustrates another embodiment of each of sequence circuits of FIG. 3 in more detail.

FIG. 5 is a generalized schematic illustration that illustrates another embodiment of each of sequence circuits 300A–B in more detail. FIG. 5 includes pairs of series-cascaded inverters 500A–F. Each pair of inverters, such as pairs 500A–B, 500C–D, 500E–F, receives the input signal at input terminal 305 and provide a sequentially delayed signal in response thereto at respective output terminals 310A–C. Each pair of inverters, such as pairs 500A–B, 500C–D, 500E–F, has a capacitance interposed therebetween, such as respective capacitances 505A–C. The capacitances 505A–C are preferably trimmably adjustable, such as by fuse or other programmable elements, for tailoring the delays between the signal transition at the input terminal 305 and the signal transition at each of the output terminals 310A–C.

Figure 6:
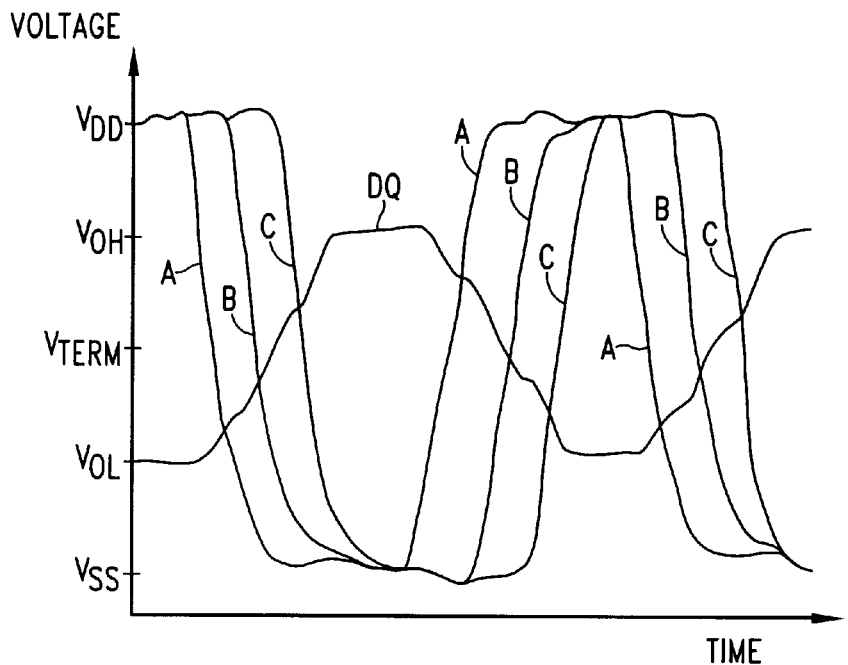
FIG. 6 is a graph illustrating the voltage vs. time waveforms of the output driver circuit of FIG. 2.

FIG. 6 is a graph illustrating the voltage vs. time waveforms of the output driver circuit 100. In FIG. 6, signal A represents the voltage waveform at nodes 205A and 255A, signal B represents the voltage waveform at nodes 205B and 255B, and signal C represents the voltage waveform at nodes 205C and 255C, and signal DQ represents the voltage waveform at node 130. Thus, FIG. 6 illustrates the slew-rate tailoring of transitions in the DQ signal in response to the sequentially delayed control terminal signals provided by wave-shaping control circuit 202. FIG. 6 also illustrates the reduced signal swing, i.e. $V_{OH}$ and $V_{OL}$ voltage levels, provided by impedances 210 and 260 in conjunction with terminating resistor 170. Providing an odd number of output transistors in each of the first plurality 200 and second plurality 250 of output transistors, avoids a plateau in signal DQ at the $V_{term}$, voltage.

Figure 7:
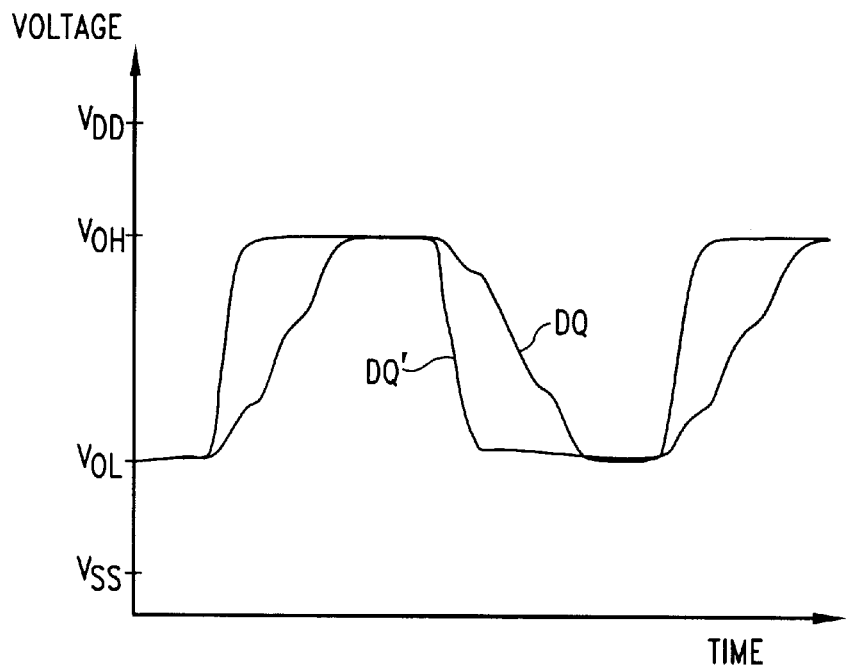
FIG. 7 is a graph illustrating the voltage vs. time waveform of the voltage DQ at the output node of the output driver circuit of FIG. 2 with respect to a voltage DQ' at the output node of a typical output driver circuit.

FIG. 7 is a graph illustrating the voltage vs. time waveform of the voltage DQ at output node 130 of output driver circuit 100 with respect to a voltage DQ' of a conventional output driver circuit without the slew-rate waveshaping provided by the present invention. As seen in FIG. 7, the slew rate of voltage transitions of the voltage DQ according to the output driver circuit 100 of the present invention may be controlled more precisely that the voltage transitions of the voltage DQ' according to the conventional output driver circuit.

FIG. 7 illustrates the case wherein each of the output transistors in the first plurality 200 and second plurality 250 are equally weighted; their effective width/length aspect ratios are substantially identical. As seen in FIG. 7, this results in an approximately linear slew rate wave-shaping.

Figure 8:
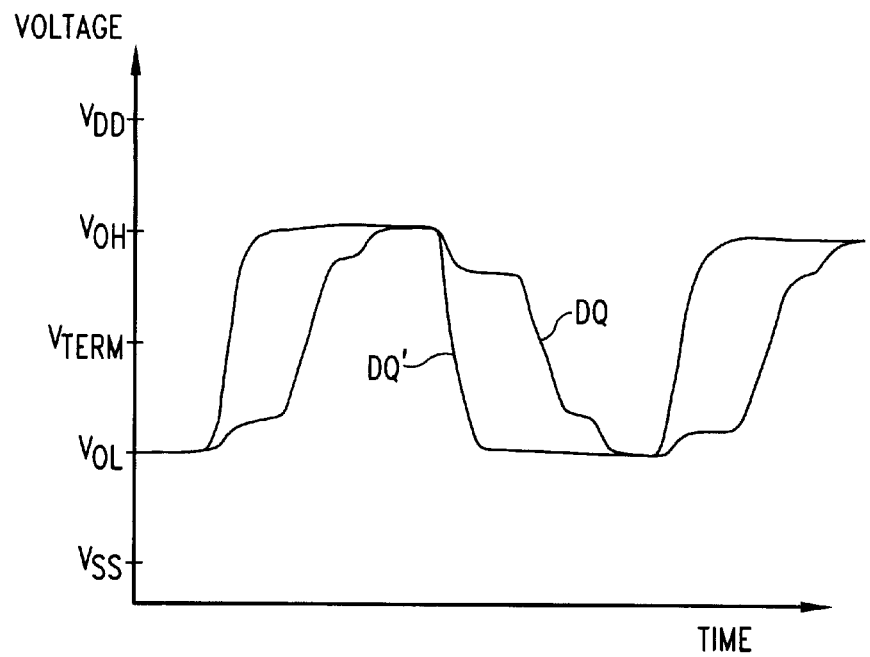
FIG. 8 is a graph, similar to FIG. 7, of waveforms resulting from a first unequal weighting of the output transistors.

FIG. 8 is a graph, similar to FIG. 7, in which the output transistors in the first plurality 200 and second plurality 250 of output transistors are not equally weighted. FIG. 8 illustrates the case where the intermediate transistors, such as 200B and 250B, have effective width/length aspect ratios that are larger than the effective width/length aspect ratios of the end transistors, such as 200A,, 200C, 250A, and 250C. In this embodiment, the slew rate of the voltage DQ at output node 130 is faster near the midpoint between the $V_{OH}$ and $V_{OL}$ levels.

Figure 9:
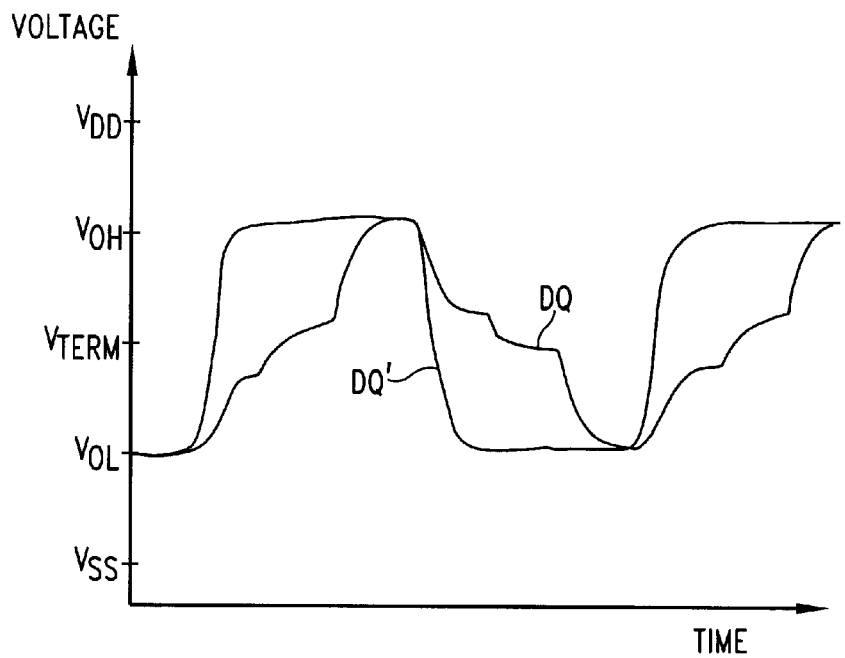
FIG. 9 is a graph, similar to FIG. 7, of waveforms resulting from a second unequal weighting of the output transistors.

FIG. 9 is a graph, similar to FIG. 7, in which the output transistors in the first plurality 200 and second plurality 250 of output transistors are not equally weighted. FIG. 9 illustrates the case where the intermediate transistors, such as 200B and 250B, have effective width/length aspect ratios that are smaller than the effective width/length aspect ratios of the end transistors, such as 200A, 200C, 250A, and 250C. In this embodiment, the slew rate of the voltage DQ at output node 130 is faster near the each of the $V_{OH}$ and $V_{OL}$ levels than near the midpoint between these two levels.

FIGS. 7–9 illustrate different approaches to weighting output transistors in each of the first plurality 200 and second plurality 250 of output transistors. Ones of the first plurality 200 of output transistors could also be weighted differently from ones of the second plurality 250 of output transistors; many combinations are possible in order to obtain the desired wave-shaping of the voltage DQ at output node 130.

Figure 10:
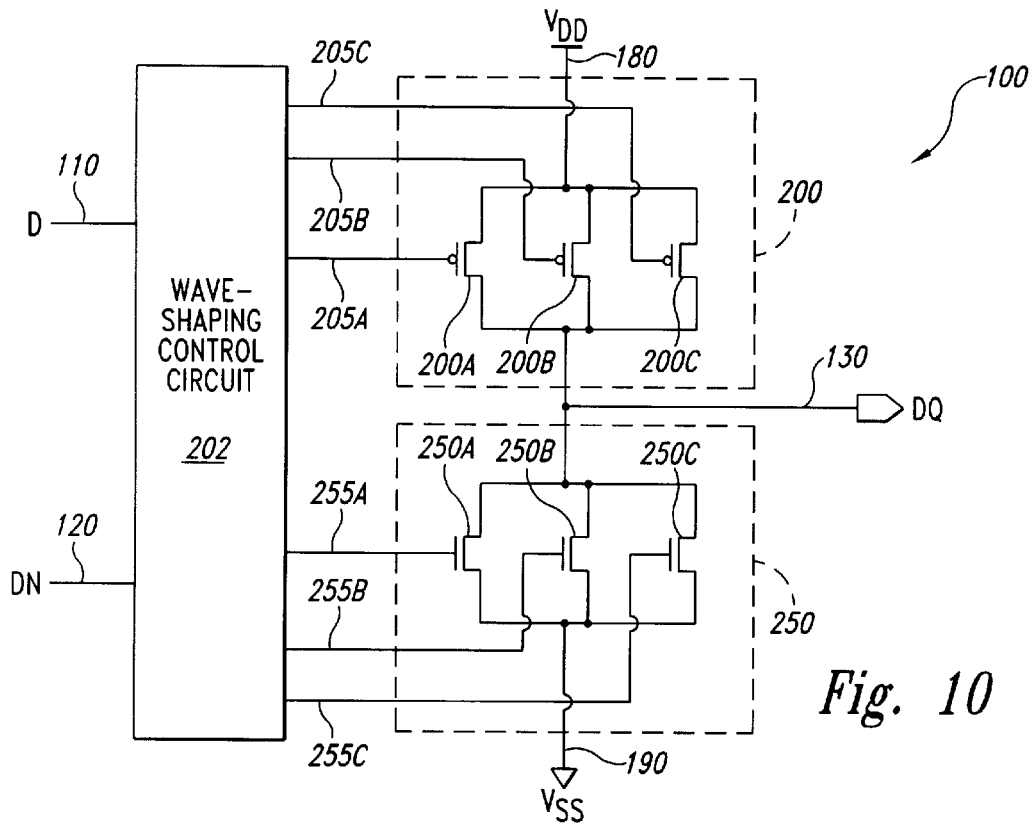
FIG. 10 is a generalized schematic illustration of an alternate embodiment of the output driver circuit in which the first and second impedances are not included.

FIG. 10 is a generalized schematic illustration that illustrates an alternate embodiment of the output driver circuit 100. In FIG. 8, first and second impedances 210 and 260, respectively, and corresponding $V_{OH}$ and $V_{OL}$ level control circuits 212 and 272, are not present. This embodiment offers slew rate and other wave-shaping of the transitions in the voltage DQ at output node 130, but does not adjust the $V_{OH}$ and $V_{OL}$ output levels by controlling impedances.

Figure 11:
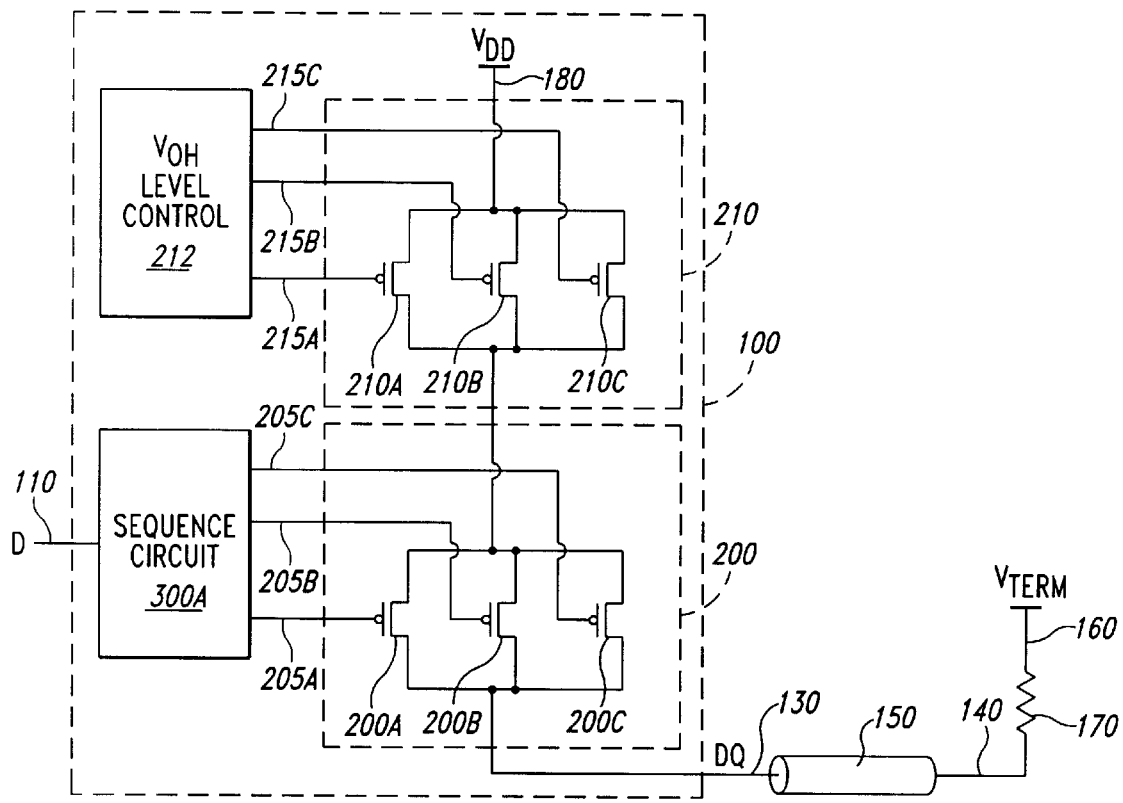
FIG. 11 is a generalized schematic illustration of an alternate embodiment of the output driver circuit for single-ended wave-shaping and binary high logic voltage level setting.

FIG. 11 is a generalized schematic illustration that illustrates a single-ended alternate embodiment of the output driver circuit 100. In FIG. 11, the second plurality 250 of output transistors and second impedance 260 are not present. This embodiment offers slew rate and $V_{OH}$ level control of the voltage DQ at output node 130; the $V_{OL}$ level is established at $V_{term}$ by the resistive connection through termination resistors 170 to the termination voltage at node 160.

Figure 12:
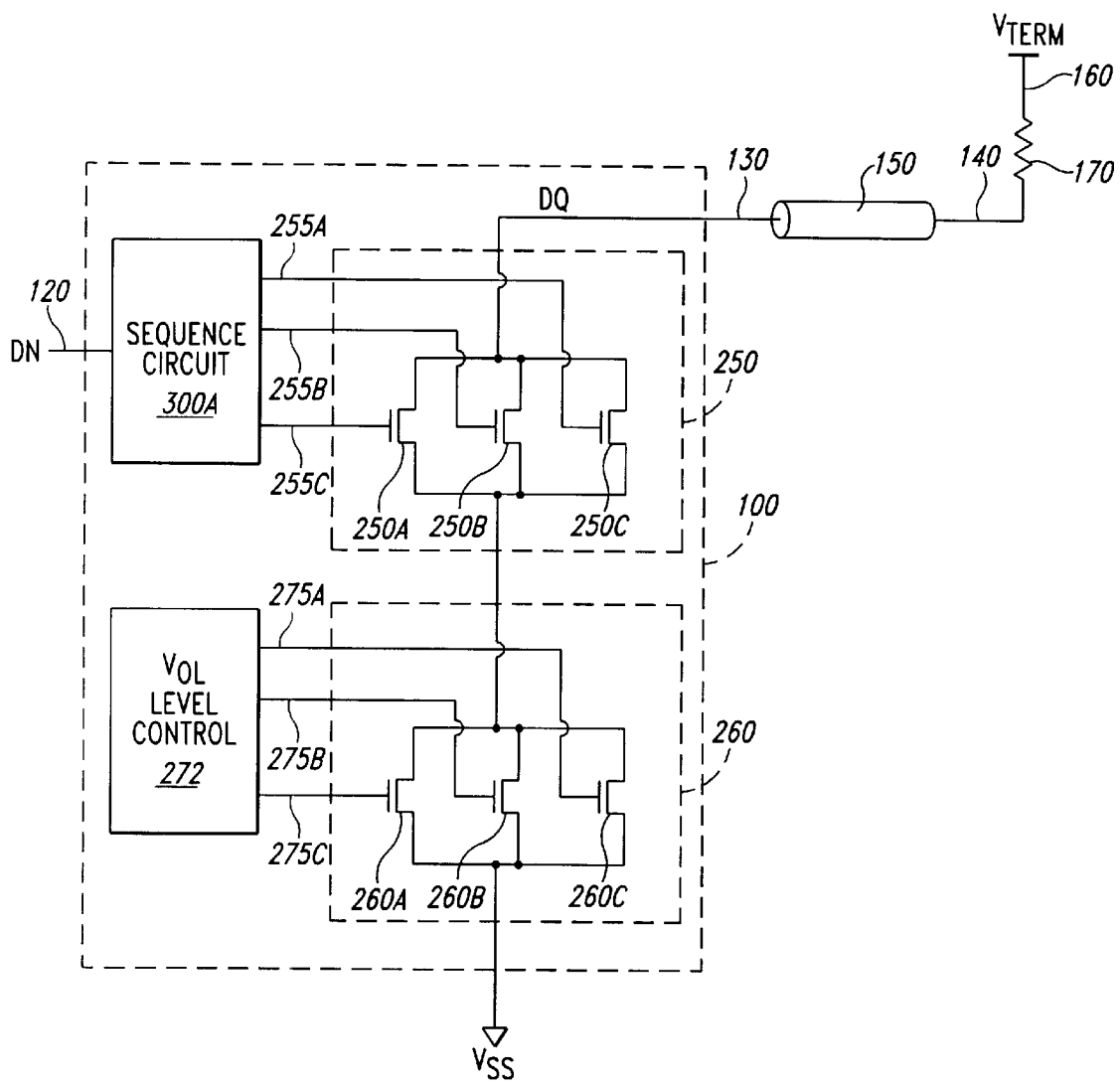
FIG. 12 is a generalized schematic illustration of an alternate embodiment of the output driver circuit for single-ended wave-shaping and binary low logic voltage level setting.

FIG. 12 is a generalized schematic illustration that illustrates another single-ended alternate embodiment of the output driver circuit 100. In FIG. 12, the first plurality 200 of output transistors and first impedance 210 are not present. This embodiment offers slew rate and $V_{OL}$ level control of the voltage DQ at output node 130; the $V_{OH}$ level is established at $V_{term}$ by the resistive connection through termination resistors 170 to the termination voltage at node 160.

Thus the present invention includes method and apparatus of wave-shaping a signal, including logic voltage levels and a slew rate of a voltage transition therebetween. The present invention is particularly useful for high speed data communications, such as in a synchronous memory including a dynamic random access memory (DRAM).

Although specific embodiments have been illustrated and described herein, it will be appreciated by those of ordinary skill in the art that any arrangement which is calculated to achieve the same purpose may be substituted for the specific embodiment shown. This application is intended to cover any combinations, adaptations, or variations of the present invention. Therefore, it is manifestly intended that this invention be limited only by the claims and the equivalents thereof.

What is claimed is:

1. An output driver circuit, comprising:
   a first plurality of output transistors coupled to each other in parallel between a first intermediate node and an output node, each of the output transistors having a control terminal that controls the impedance of the respective output transistor;
   a first control circuit sequentially applying to the control terminals of the output transistors at different times respective control signals rendering the output transistors conductive; and
   a reprogrammable first impedance coupled between the first plurality of output transistors and a first power supply node, the first impedance including a plurality of transistors coupled to each other in parallel that are programmed on or off to obtain a desired reprogrammable first impedance.

2. The output driver circuit of claim 1 wherein the transistors that are programmed to obtain the desired programmable first impedance each have a gate terminal that receives a respective binary logic level.

3. The output driver circuit of claim 1 further comprising:
a second plurality of output transistors coupled to each other in parallel between a second intermediate node and the output node, each of the output transistors having a control terminal that controls the impedance of the respective output transistor;
a second control circuit sequentially applying to the control terminals of the output transistors in the second plurality at different times respective control signals rendering the output transistors conductive; and
a reprogrammable second impedance coupled between the second plurality of output transistors and a second power supply node, the second impedance including a plurality of transistors coupled to each other in parallel that are programmed on or off to obtain a desired reprogrammable second impedance.

4. An output driver circuit, comprising:
a first plurality of transistors coupled to each other in parallel between a first power supply voltage and a first intermediate node;
a first level control circuit having a plurality of outputs coupled to respective control terminals of the first plurality of transistors, the first level control circuit being operable to apply respective first level control signals to the control terminals to render a predetermined number of the first plurality of transistors conductive;
a second plurality of transistors coupled to each other in parallel between the first intermediate node and an output node;
a first wave shaping control circuit having a plurality of outputs coupled to respective control terminals of the second plurality of transistors, the first wave shaping control circuit being operable to apply respective first level control signals to the control terminals to sequentially render each of the second plurality of transistors conductive or non-conductive.

5. The output circuit of claim 4 wherein each of the first plurality of transistors have substantially the same impedance when the first plurality of transistors are conductive.

6. The output circuit of claim 4 wherein each of the first plurality of transistors have a different impedance when the first plurality of transistors are conductive.

7. The output circuit of claim 4 wherein each of the second plurality of transistors have substantially the same impedance when the first plurality of transistors are conductive.

8. The output circuit of claim 4 wherein each of the second plurality of transistors have a different impedance when the first plurality of transistors are conductive.

9. The output circuit of claim 4 further comprising:
a third plurality of transistors coupled to each other in parallel between a second power supply voltage and a second intermediate node;
a second level control circuit having a plurality of outputs coupled to respective control terminals of the third plurality of transistors, the second level control circuit being operable to apply respective second level control signal to the control terminals to render a predetermined number of the third plurality of transistors conductive;
a fourth plurality of transistors coupled to each other in parallel between the second intermediate node and the output node;
a second wave shaping control circuit having a plurality of outputs coupled to respective control terminals of the fourth plurality of transistors, the second wave shaping control circuit being operable to apply respective second level control signals to the control terminals to sequentially render each of the fourth plurality of transistors conductive or non-conductive.

10. A method of providing a data signal at an output node, the method comprising:
programming the impedance of a reprogrammable impedance coupled between a power supply node and an intermediate node;
coupling the intermediate node to the output node through a plurality of impedance elements connected in parallel with each other; and
sequentially rendering each of the impedance elements conductive.

11. The method of claim 10 wherein the act of coupling the intermediate node to the output node comprises coupling a plurality of transistors in parallel between the intermediate node and the output node, and wherein the act of sequentially rendering each of the impedance elements conductive comprises sequentially rendering each of the transistors conductive or non-conductive.

12. The method of claim 10 wherein the act of programming the impedance of the reprogrammable impedance comprises:
coupling a plurality of transistors in parallel between the power supply node and the intermediate node; and
simultaneously rendering at least some of the transistors conductive.

13. The method of claim 10 further comprising, after sequentially rendering each of the intermediate elements conductive, reprogramming the impedance of the reprogrammable impedance.

14. The method of claim 10 further comprising terminating the output node with a resistor.

15. The method of claim 10 wherein each of the impedance elements have the same impedance when they are conductive.

16. The method of claim 10 wherein at least some of the impedance elements have different impedances when they are conductive.

17. A method of providing a data signal at an output node, the method comprising:
programming the impedance of a first reprogrammable impedance coupled between a first power supply node and an intermediate node;
programming the impedance of a second reprogrammable impedance coupled between a second power supply node and an intermediate node;
sequentially coupling the first intermediate node to the output node through a plurality of first impedance elements connected in parallel with each other while the second intermediate node is decoupled from the output node; and
sequentially coupling the second intermediate node to the output node through a plurality of second impedance elements connected in parallel with each other while the first intermediate node is decoupled from the output node.

18. The method of claim 17 wherein the first intermediate node is decoupled from the output node by sequentially decoupling the first intermediate node from the output node through the plurality of first impedance elements, and the second intermediate node is decoupled from the output node by sequentially decoupling the second intermediate node from the output node through the plurality of second impedance elements.

19. The method of claim 17 wherein the acts of sequentially coupling the first and second intermediate nodes to the output node each comprise:

coupling a plurality of transistors in parallel between the intermediate node and the output node; and sequentially rendering each of the transistors conductive.

20. The method of claim 17 wherein the act of programming the impedance of the first and second reprogrammable impedances each comprise:

coupling a plurality of transistors in parallel between the power supply node and the intermediate node; and simultaneously rendering at least some of the transistors conductive.

21. The method of claim 17 further comprising reprogramming the impedances of the first and second reprogrammable impedance.

22. The method of claim 17 further comprising terminating the output node with a resistor.

23. The method of claim 17 wherein the act of sequentially coupling the first intermediate node to the output node through a plurality of first impedance elements comprises sequentially coupling the first intermediate node to the output node through a plurality of first impedance elements having the same impedance.

24. The method of claim 17 wherein the act of sequentially coupling the first intermediate node to the output node through a plurality of first impedance elements comprises sequentially coupling the first intermediate node to the output node through a plurality of first impedance elements at least some of which have different impedances.

25. A method of providing a data signal at an output node, the method comprising:

coupling a first adjustably reprogrammable impedance to a first power supply to generate an adjustably reprogrammable steady-state first logic voltage; and in response to a first input signal, sequentially coupling or decoupling the output node to the first logic voltage through a first plurality of output transistors connected to each other in parallel to obtain a desired slew rate of the output signal, the act of sequentially coupling the output node to or decoupling the output from the first logic voltage including turning on or off, respectively, individual output transistors in the first plurality of output transistors at different times in response to respective transitions of the first input signal.

26. The method of claim 25, further comprising adjusting the first steady-state logic voltage by turning on or off at least one of a plurality of parallel-connected transistors forming the first adjustably reprogrammable impedance.

27. The method of claim 25, further comprising:

coupling a second adjustably reprogrammable impedance to a second power supply to generate an adjustably reprogrammable steady-state second logic voltage.

28. The method of claim 27, further comprising:

adjusting the second steady-state logic voltage by turning on or off at least one of a plurality of parallel-connected transistors forming the second adjustably reprogrammable impedance.

* * * * *

UNITED STATES PATENT AND TRADEMARK OFFICE
CERTIFICATE OF CORRECTION

PATENT NO.   : 6,084,434
DATED        : July 4, 2000
INVENTOR(S)  : Brent Keeth

It is certified that error appears in the above-identified patent and that said Letters Patent is hereby corrected as shown below:

Column 10,
Line 28, after "reprogrammable steady-state second logic voltage." insert
-- and in response to a second input signal, sequentially coupling or
   decoupling the output node to the second logic voltage
   through a second plurality of output transistors connected
   to each other in parallel to obtain a desired slew rate of the
   output signal, the act of sequentially coupling the output
   node to or decoupling the output from the second logic
   voltage including turning on or off, respectively, individual
   output transistors in the second plurality of output
   transistors at a different times in response to respective
   transitions of the second input signal. --

Signed and Sealed this

Nineteenth Day of February, 2002

*Attest:*

*Attesting Officer*

JAMES E. ROGAN
*Director of the United States Patent and Trademark Office*